(12) United States Patent
Lin et al.

(10) Patent No.: US 7,519,190 B2
(45) Date of Patent: Apr. 14, 2009

(54) CIRCUIT FOR REDUCING PULSE NOISE CAUSED AT SWITCHING OF AN ANALOG AUDIO PROCESSING CIRCUIT

(75) Inventors: Wei Cheng Lin, Taipei (TW); Yi Fan Shih, Taipei (TW); Ryan Lee, Zhong-He (TW); Carl Chang, Panchiao (TW)

(73) Assignee: Princeton Technology Corporation, Taipei County (TW)

( * ) Notice: Subject to any disclaimer, the term of this patent is extended or adjusted under 35 U.S.C. 154(b) by 927 days.

(21) Appl. No.: 11/107,835

(22) Filed: Apr. 18, 2005

(65) Prior Publication Data

US 2006/0251273 A1    Nov. 9, 2006

(51) Int. Cl.
*H02B 1/00* (2006.01)
(52) U.S. Cl. .......................................... 381/123; 330/51
(58) Field of Classification Search .................. 381/106, 381/123, 120, 111, 113, 94.1, 94.5, 94.7; 330/51
See application file for complete search history.

(56) References Cited

U.S. PATENT DOCUMENTS

| | | | | |
|---|---|---|---|---|
| 3,296,499 A * | 1/1967 | Quinlan | ...................... | 361/193 |
| 4,888,496 A * | 12/1989 | Schmitz | ...................... | 327/306 |
| 5,798,959 A * | 8/1998 | Onetti et al. | .................. | 365/26 |
| 6,693,491 B1 * | 2/2004 | Delano | ........................ | 330/282 |
| 7,039,203 B2 * | 5/2006 | Heyl | ........................... | 381/119 |

* cited by examiner

*Primary Examiner*—Vivian Chin
*Assistant Examiner*—Con P Tran
(74) *Attorney, Agent, or Firm*—Muncy, Geissler, Olds & Lowe, PLLC

(57) ABSTRACT

A noise reduction circuit for reducing pulse noise caused at switching of an analog audio processing circuit comprises a voltage division resistor circuit, an end of the voltage division resistor circuit being electrically connected to an output end of a switching circuit of the analog audio processing circuit, and another end of the voltage division resistor circuit being electrically connected to a reference voltage; a plurality of voltage-division points of the voltage division resistor circuit are connected respectively with a plurality of controllable switches, while other ends of the plurality of controllable switches are connected together to form an output end.

1 Claim, 3 Drawing Sheets

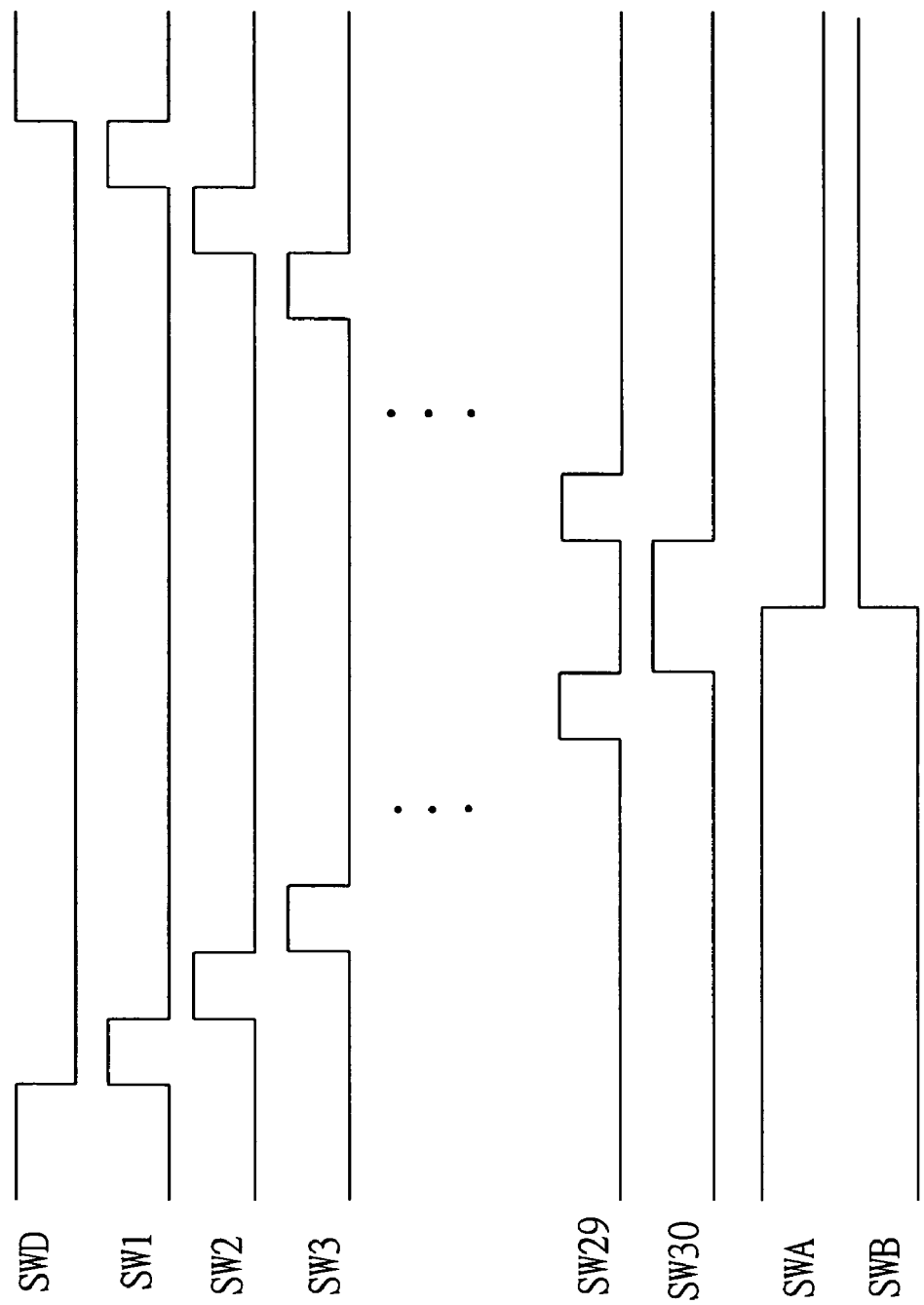

CIRCUIT FOR REDUCING PULSE NOISE CAUSED AT SWITCHING OF AN ANALOG AUDIO PROCESSING CIRCUIT

FIELD OF THE INVENTION

The present invention relates to an improvement of an analog audio processing circuit, and more particularly to a circuit for reducing pulse noise caused at switching of an analog audio processing circuit.

BACKGROUND OF THE INVENTION

Referring to FIG. 1, which shows a conventional analog audio processing circuit, wherein a signal S is inputted to the left side of an input buffer 1, and then into an output buffer 4 after passing through an audio processing circuit 2 and a switching circuit 3. The switching circuit 3 can optionally input the output B of the audio processing circuit 2 or the output A of the input buffer 1 into the input D of the output buffer 4. A voltage reference circuit 5 is used to provide a reference voltage C for the input buffer 1, the audio processing circuit 2 and the output buffer 4.

Generally, the input buffer 1 is an operational amplifier, and so is the output buffer 4. The audio processing circuit 2 is used for processing the volume, alt, bourdon, surround sound effect, stereo, etc, generally includes six operational amplifiers.

Each of the operational amplifiers generates offset voltage. Suppose that the offset voltage $\Delta V$ is 10 mV, the reference voltage C of the voltage reference circuit 5 is 4.5 V, then:

the output A of the input buffer $\mathbf{1} = C + \Delta V = 4.510V$.

the output B of the audio processing circuit $\mathbf{2} = C + 6 \times \Delta V + X$ (X is generated by the surround sound effect and the stereo sound, and is about 50 mV), so B=4.610V This means that when the switching circuit 3 switches between the output B of the audio processing circuit 2 and the output A of the input buffer 1, it will generate a 100 mV voltage difference, and this is the reason why a sound like "bo" will always be caused when the user turns on/off the switching circuit 3, and this is so-called pulse noise, music player's headache.

The present invention has arisen to mitigate and/or obviate the afore-described disadvantages.

SUMMARY OF THE INVENTION

The primary objective of the present invention is to provide a circuit for reducing pulse noise caused at switching of an analog audio processing circuit, comprising a voltage division resistor circuit, an end of the voltage division resistor circuit being electrically connected to an output end of a switching circuit of the analog audio processing circuit, and another end of the voltage division resistor circuit being electrically connected to a reference voltage; a plurality of voltage-division points of the voltage division resistor circuit are connected respectively with a plurality of controllable switches, while other ends of the plurality of controllable switches are connected together to form an output end; a first one of the controllable switches serves as a master control switch, during switching of the switching circuit, the master control switch will firstly be turned off automatically for a while, and then the rest controllable switches will be controlled sequentially by a series of continuous short pulses, so that the rest controllable switches are turned on and then turned off, starting from the second switch to the last switch, afterwards, the rest controllable switches are turned on and turned off again, starting from the last switch to the second switch; and finally the master control switch is turned on, and thus the switching of the analog audio processing circuit is accomplished without causing pulse noise.

The present invention will become more obvious from the following description when taken in connection with the accompanying drawings, which show, for purpose of illustrations only, the preferred embodiment in accordance with the present invention.

BRIEF DESCRIPTION OF THE DRAWINGS

FIG. 3 shows the waveforms of the switching circuit in accordance with the present invention.

DETAILED DESCRIPTION OF THE PREFERRED EMBODIMENT

Figure 1:
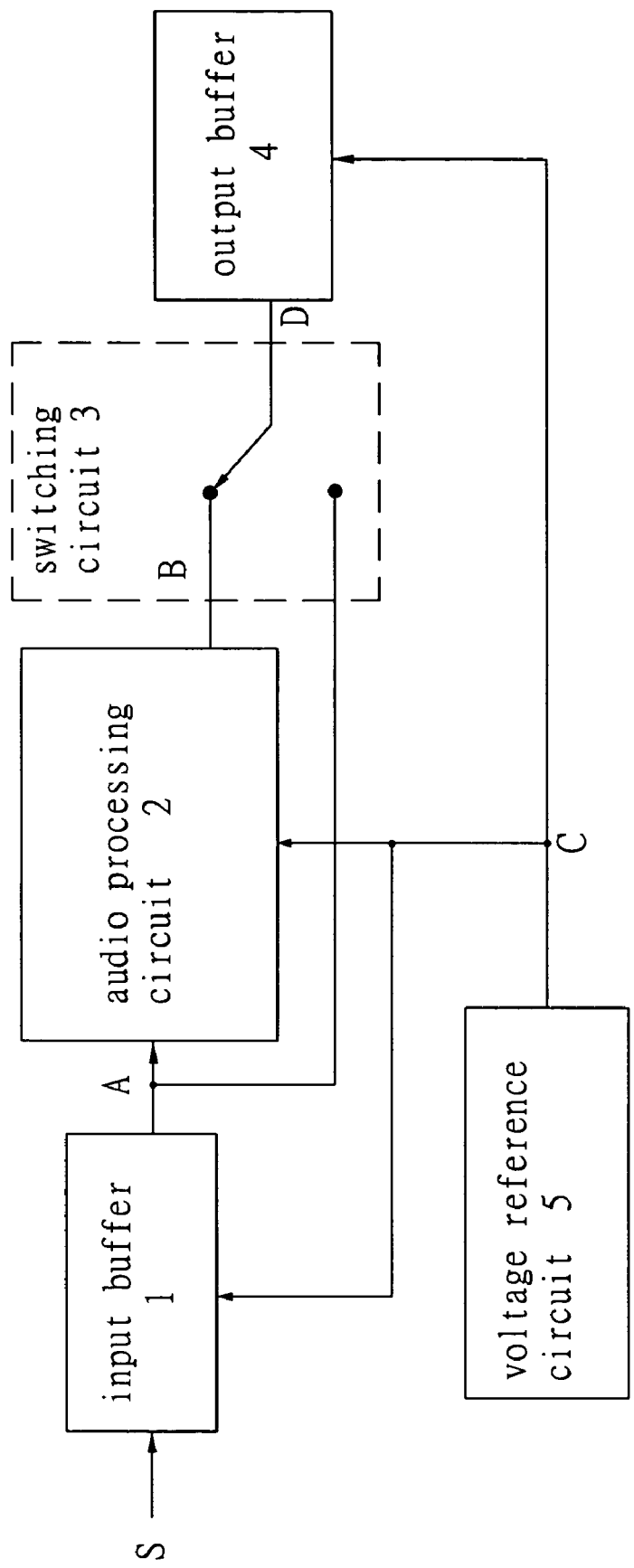
FIG. 1 is a block diagram of a conventional analog audio processing circuit.
Figure 2:
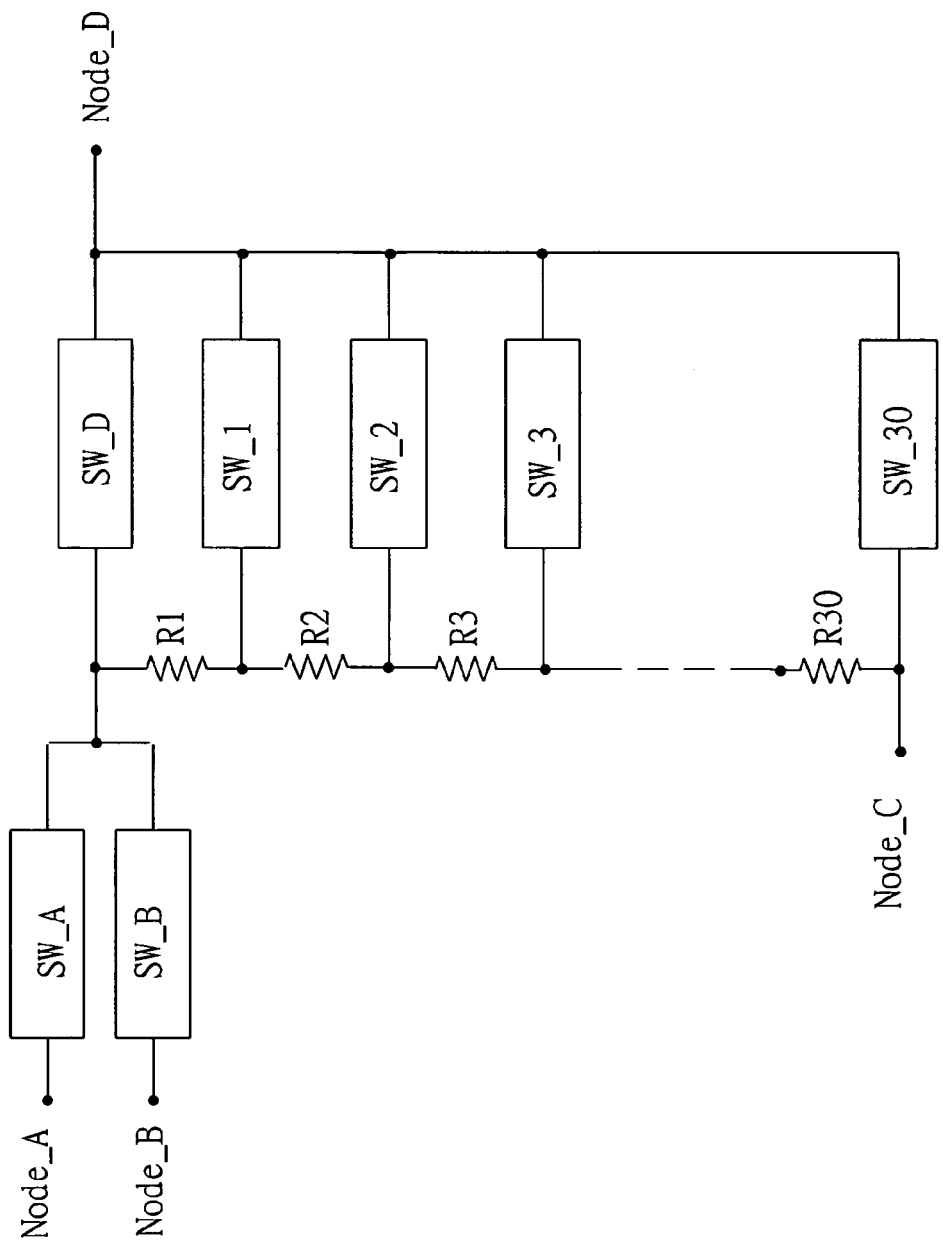
FIG. 2 shows a switching circuit in accordance with the present invention.

Referring to FIG. 2, a circuit for reducing pulse noise caused at switching of an analog audio processing circuit in accordance with the present invention is shown and employed to replace the switching circuit 3 of FIG. 1. Node_A, Node_B and Node_D in FIG. 2 are connected respectively to the point A, B and D of FIG. 1. SW_A and SW_B are switches for selecting the output B of the audio processing circuit 2 or the output A of the input buffer 1. The circuit for reducing pulse noise caused at switching of an analog audio processing circuit in accordance with the present invention is additionally provided with a plurality of switches SW_D, SW_1, SW_2, SW_3, . . . SW_30 and a plurality of resistors R1, R2, R3, . . . R30, which are electrically connected as shown in FIG. 2. The Node_C is located at the connection between R30 and SW_30, and is connected to the reference voltage point C of the voltage reference circuit 5 in FIG. 1. All of the resistors R1, R2, R3, . . . R30 have the same resistance.

Control signals of the switches SW_A and SW_B are indicated as SWA and SWB, and control signals of the switches SW_D, SW_1, SW_2, SW_3, . . . SW_30 are indicated as SWD, SW1, SW2, SW3, . . . SW30. The wavefoms of SWA, SWB and SWD, SW1, SW2, SW3, . . . SW30 are shown in FIG. 3.

Since the Node_C at the connection of the R30 and the SW_30 is connected to the reference voltage point C of the voltage reference circuit 5 in FIG. 1, the Node_C is maintained at a constant voltage (4.5 V for example), it will generate a voltage dividing effect on the resistors R1, R2, R3, . . . R30. If the voltage of Node_A is 4.510V, and the SW_A is turned on while the SW_B is turned off, the voltage at the connection between the resistors R1 and R2 will be 4.50967 V, and the rest can be deduced by this analogy.

FIG. 3 shows that when the SWA is changed from "1" to "0", and the SWB is changed from "0" to "1", namely, the input of the circuit in FIG. 2 is switched from the output A of the input buffer 1 to the output B of the audio processing circuit 2, the wavefrom of the SWD will firstly be changed to "0". When the SWD is "0", the waveforms of the SW1, SW2, SW3, . . . SW30 are a series of continuous short pulses, starting from the SW1 to SW30, and then from SW30 to SW1. These short pulses are used to turn on the switches SW_1, SW_2, SW_3, . . . SW_30 respectively. When the SW_1 is turned on, the SWA is still "1", the output A of the input buffer 1 is inputted to D after passing through R1 and SW_1, consequently, the output A of the input buffer 1 will be attenuated slightly by the resistor R1. After the SW_2 is turned on, the SWA is still "1", the output A of the input buffer 1 is inputted to D after passing through R1, R2 and SW_2, consequently, the output A of the input buffer 1 will be further attenuated by the resistors R1+R2, and in this way, when the SWA is going to be changed from "1" to "0", the output A of the input buffer 1 has been attenuated by the resistors R1+R2+R3+ . . . +R30. When the SWA is changed from "1" to "0", and the SWB is changed from "0" to "1", the voltage inputted to the point D is the reference voltage C of 4.5 V, at this moment, the output A of the input buffer 1 has been switched to the output B of the audio processing circuit 2. The pulse wavefrom, starting from the SW30 to SW1, will be in the form of serial continuous short pulses, so that the output B (as previously mentioned it is supposed to be 4.610V) of the audio processing circuit 2 will be attenuated by the resistors R1+R2+R3+ . . . +R30, initial value is 4.5 V, and then it will be recovered step by step to 4.610V. In this way, there is no any sound "bo" as generated in the prior art. After the output B returns to the route of R1 and SW_1, the next step is that SWD will be recovered to "1" to turn on the SW_D, so that the output B of the audio processing circuit 2 is inputted directly to the point D, consequently, the switching operation of the switching circuit is accomplished.

While we have shown and described various embodiments in accordance with the present invention, it should be clear to those skilled in the art that further embodiments may be made without departing from the scope of the present invention.

What is claimed is:

1. A noise reduction circuit for reducing pulse noise caused at switching of an analog audio processing circuit, comprising a voltage division resistor circuit, an end of the voltage division resistor circuit being electrically connected to an output end of a switching circuit of the analog audio processing circuit, and another end of the voltage division resistor circuit being electrically connected to a reference voltage; a plurality of voltage-division points of the voltage division resistor circuit are connected respectively with a plurality of controllable switches, while other ends of the plurality of controllable switches are connected together to form an output end; a first one of the controllable switches serves as a master control switch, during switching of the switching circuit, the master control switch will firstly be turned off automatically for a while, and then the rest controllable switches will be controlled sequentially by a series of continuous short pulses, so that the rest controllable switches are turned on and then turned off, starting from the second switch to the last switch, afterwards, the rest controllable switches are turned on and turned off again, starting from the last switch to the second switch; and finally the master control switch is turned on, and thus the switching of the analog audio processing circuit is accomplished without causing pulse noise.

* * * * *